United States Patent [19]
Malaczynski et al.

[11] Patent Number: 5,458,927
[45] Date of Patent: Oct. 17, 1995

[54] PROCESS FOR THE FORMATION OF WEAR- AND SCUFF-RESISTANT CARBON COATINGS

[75] Inventors: Gerard W. Malaczynski, Bloomfield Hills; Xiaohong Qiu, Sterling Heights; Joseph V. Mantese; Alaa A. Elmoursi, both of Troy; Aboud H. Hamdi, Warren, all of Mich.; Blake P. Wood; Kevin C. Walter, both of Los Alamos, N.M.; Michael A. Nastasi, Espanola, N.M.

[73] Assignee: General Motors Corporation, Detroit, Mich.

[21] Appl. No.: 401,110

[22] Filed: Mar. 8, 1995

[51] Int. Cl.⁶ .................................................. B05D 3/06
[52] U.S. Cl. .................... 427/527; 427/249; 427/255; 427/255.7; 427/327; 427/331; 427/399; 427/419.1; 427/419.7; 427/435; 427/523; 427/528; 427/530; 427/534; 427/535; 427/577
[58] Field of Search ..................... 427/527, 249, 427/255, 255.7, 327, 331, 399, 419.1, 419.7, 435, 523, 528, 530, 534, 535, 577

[56] References Cited

U.S. PATENT DOCUMENTS

| | | | |
|---|---|---|---|
| 4,764,394 | 8/1988 | Conrad | 427/38 |
| 4,974,498 | 12/1990 | Lemelson | 92/223 |
| 5,237,967 | 8/1993 | Willermet et al. | 123/90.51 |
| 5,249,554 | 10/1993 | Tamor et al. | 123/90.51 |
| 5,309,874 | 5/1994 | Willermet et al. | 123/90.51 |

OTHER PUBLICATIONS

Conrad et al, "Plasma Source Ion Implantation: A New, Cost-Effective, Non-Line-of-Sight Technique for Ion Implantation of Materials", *Surface and Coatings Technology*, 36 (1988) 927–937 (No month available).

Grill et al, "Interface Modifications for Improving the Adhesion of a-C:H films to Metals", *Journal of Materials Research*, vol. 3, No. 2, Mar./Apr. 1988, pp. 214–217.

Harris et al, "A Diamond-Like Carbon Film for Wear Protection of Steel", *Surface and Coatings Technology*, 62 (1993) 550–557 (No month available).

Wood et al, "Initial Operation of a Large-Scale Plasma Source Ion Implantation Experiment", *J. Vac. Sci. Technol. B*, vol. 12, No. 2, Mar./Apr. 1994, pp. 870–874.

*Primary Examiner*—Bernard Pianalto
*Attorney, Agent, or Firm*—George A. Grove

[57] ABSTRACT

A process for forming an adherent diamond-like carbon coating on a workpiece of suitable material such as an aluminum alloy is disclosed. The workpiece is successively immersed in different plasma atmospheres and subjected to short duration, high voltage, negative electrical potential pulses or constant negative electrical potentials or the like so as to clean the surface of oxygen atoms, implant carbon atoms into the surface of the alloy to form carbide compounds while codepositing a carbonaceous layer on the surface, bombard and remove the carbonaceous layer, and to thereafter deposit a generally amorphous hydrogen-containing carbon layer on the surface of the article.

4 Claims, 1 Drawing Sheet

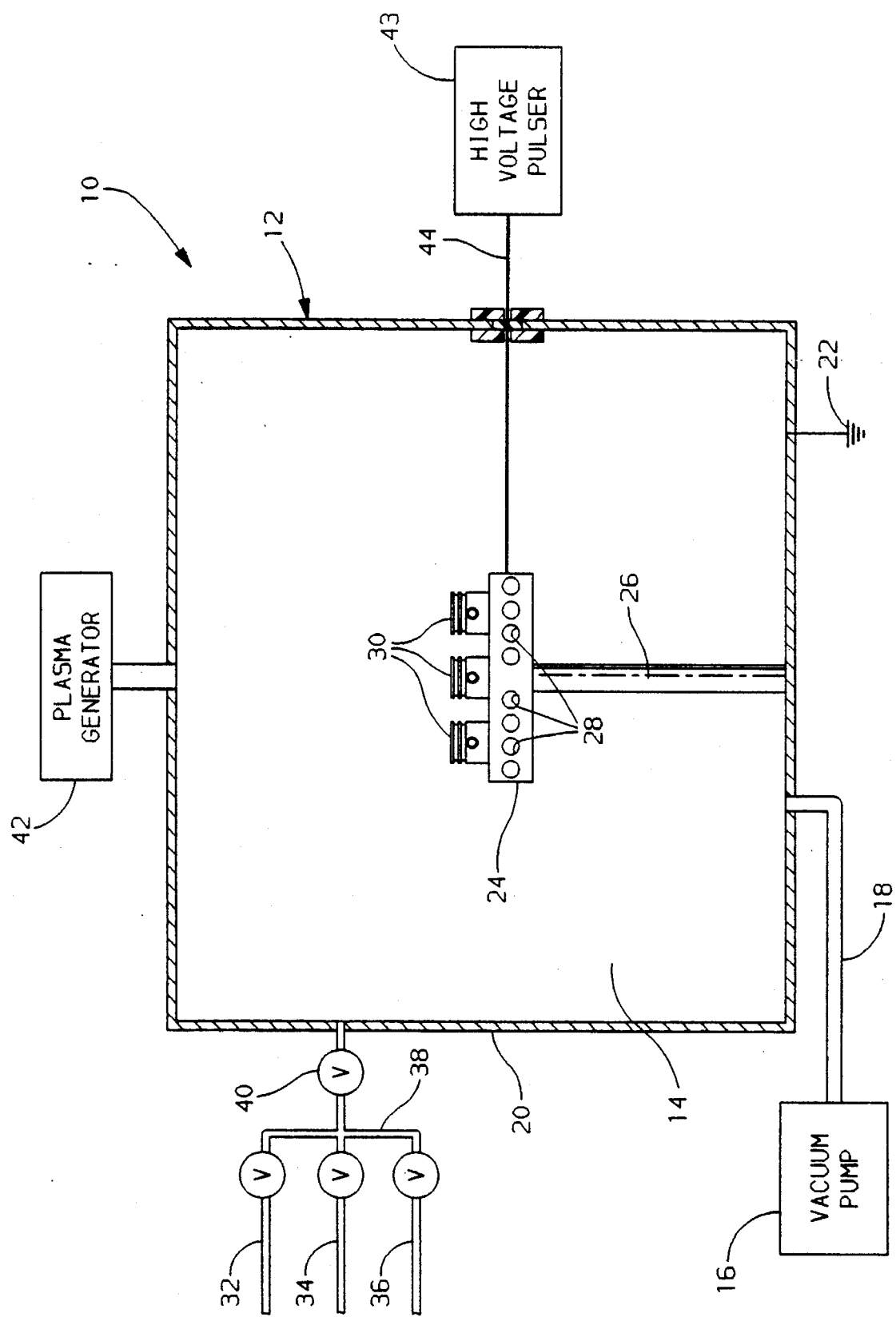

PROCESS FOR THE FORMATION OF WEAR- AND SCUFF-RESISTANT CARBON COATINGS

This invention pertains to an efficient practice for the formation of adherent, hard, low friction carbon coatings on a variety of three-dimensional material surfaces. In a specific, illustrative application, this invention pertains to the formation of such diamond-like carbon coatings on silicon-containing aluminum alloy articles in a process that is amenable to high volume usage, especially for irregularly-shaped articles such as automobile parts.

BACKGROUND OF THE INVENTION

In a continual effort to reduce weight and improve the fuel efficiency of automotive vehicles and the like, engineers seek to substitute lighter (and usually softer) materials such as aluminum and magnesium alloys for the more dense and more scuff- and wear-resistant iron and steel alloys that are widely used. Often the substitution of aluminum in engines and other powertrain component applications exposes them to sliding contact with other aluminum parts. While aluminum alloy parts are strong, they are susceptible to wear and scuffing when they rub on each other. Their surface properties are such that they must be adequately lubricated in such applications. For example, it is desirable to employ aluminum alloy pistons in an aluminum alloy engine block. In normal warmed-up engine operation, a film of oil can be maintained between each reciprocating piston and its cylinder wall. However, during cold start and other situations, if the oil film has not been established, aluminum surfaces in sliding engagement will soon scuff. Material from the piston or the engine block surface is transferred to the opposite member, which causes additional scuffing and tearing and failure of the parts.

Thus, where aluminum alloy pistons and engine blocks are used in automotive engine applications, it is the practice to provide iron liners in the cylinder walls of the aluminum block. The aluminum pistons then engage iron liners, and even during cold starts, no scuffing or undue wear occurs. However, the manufacture and placement of iron liners in the cylinder bores of an aluminum engine block represent an undesirable additional expense and weight.

The properties of certain amorphous hydrogen-containing carbon deposits have been investigated as protective layers on surfaces that are to be subjected to wear or scuffing. When suitably formed, these carbonaceous materials are found to be extremely hard and wear resistant, and they are sometimes called diamond-like carbon. Once recognized, it has been suggested that such coatings could be used on aluminum alloy components in sliding engagement with other aluminum alloy components in automotive powertrain environments. See, for example, U.S. Pat. Nos. 5,237,967; 5,249,554 and 5,309,874. However, the difficulty in utilizing such hard carbon coatings on automotive components is that the cost of forming adherent and uniform coatings on workpieces of complex shape has been too high. In other words, the processing has been too slow and too cumbersome.

Accordingly, it is an object of the present invention to provide an efficient process of applying adherent, hard and low friction amorphous carbon coatings to the surfaces of three-dimensional workpieces of suitable materials susceptible to carbon ion implantation. The present process is particularly useful on workpieces of aluminum alloys, ferrous metal alloys and other alloys capable of forming intermetallic carbides. It is a further object to provide a method of providing such coatings that strongly adhere to the workpiece substrate. It is a still further object of the present invention to provide a method that is efficient and practical enough for automotive manufacturing requirements.

In accordance with this invention, these and other objects and advantages are accomplished as follows.

SUMMARY OF THE INVENTION

A preferred application of this process is in the formation of adherent, diamond-like carbon coatings on aluminum alloys. For purposes of illustration, the practice of the invention will be described in connection with aluminum alloy A390, a commercial casting alloy containing, nominally by weight, 17 percent silicon, 0.8 percent iron and 4.5 percent copper. Such hypereutectic aluminum-silicon alloys are representatives of several aluminum alloys suitable for the casting of pistons and other engine and powertrain components.

The practice of the process involves implanting carbon into the surfaces of the aluminum-silicon workpiece(s) to form carbides in a shallow layer to a suitable depth of, e.g., 75 to 150 nanometers. The workpiece(s) may be of any desired configuration. Prior to ion implantation, oxygen atoms must be removed from the surface regions of the workpiece to permit silicon carbide and/or aluminum carbide formation. The surface oxides can be suitably decomposed and oxygen atoms removed by bombardment with argon ions or other chemically inert ions. Other oxide removal processes could be used.

Argon or other suitable inert gas is confined in a suitable vessel at subatmospheric pressure (0.2 mtorr to 2 mtorr, suitably 0.4 mtorr, where mtorr means millitorr). A plasma is generated in the low pressure argon gas to form a suitable concentration of positively charged argon ions. The workpiece is immersed in the plasma and is in electrical contact with a suitable high voltage pulser. The pulser apparatus applies pulses of negative electrical potential to the workpiece at a repetition rate of, for example, about 100 to 3000 Hz, suitably 2000 Hz.

The pulses are suitably of 10 to 20 µs duration. The high voltage pulser is preferably adapted to apply essentially square wave form voltage pulses so that the workpiece is very rapidly but momentarily charged to a suitable negative voltage. During each high voltage application to the workpiece, the positive argon ions in the surrounding plasma are uniformly accelerated to all surfaces of the target with an impact kinetic energy governed by the magnitude of the pulse. The high voltage pulses applied to the workpiece in combination with the positive argon ions in the plasma sputter clean the workpiece by driving off oxygen atoms from the surface. A total electrical potential of about 1 to 10 kV applied to the workpiece as negative pulses is suitable for this purpose.

In an alternative practice, a plasma is generated around the workpiece by driving the workpiece with a radio frequency signal of 100 W to 5000 W, suitably 1000 W. This produces a concentration of positive argon ions around the workpiece. The rf signal also produces a negative dc self-bias on the workpiece of 500 V to 2000 V, suitably 1000 V, which accelerates the positive argon ions toward the workpiece surface, bombarding the surface and sputtering off oxide material. This dc self-bias is hereinafter referred to as a constant negative electrical potential.

After the oxygen atoms are sputtered from the surfaces of the workpiece, plasma generation is stopped, argon is evacuated from the vessel and the vessel is backfilled with a carbon-containing gas suitable for carbon implantation. Methane and/or acetylene are preferred for this application. Again, a low pressure (suitably a few tenths of a mtorr) plasma is generated within the carbon-containing gas, which now consists of positive hydrogen-containing carbon ions. The workpiece is fully immersed in this plasma. Again, the high voltage pulser activates the workpiece by the application of high frequency, short duration pulses of negative potential at a voltage on the order of tens of kilovolts suitable for ion implantation. The effect of this step is to implant carbon ions into the surface of the workpiece to a suitable shallow depth of the order of 75 to 150 nm. The carbon ion implantation leads to formation of aluminum carbide and silicon carbide. A byproduct of this implantation step is the codeposition of a thin layer of graphitic material on the surface above the implanted carbon species.

The next step of the process involves the removal of the graphitic material. The removal of the graphitic material is necessary for the formation of an adherent coating of diamond-like carbon. This step is accomplished by the evacuation of carbon-generating plasma gas from the vessel and again backfilling with argon gas or other suitable gas that is chemically inert to the workpiece. The pressure of the plasma and the energy and frequency of electric potential pulses (or the magnitude of the dc self-bias) applied to the workpiece are essentially the same as in the oxygen removal step. This step serves to bombard the surface with positive argon ions and to sputter the surface at an energy level of about 500 eV to 10 keV so as to sputter the graphitic material from the surface and expose the desired surface of the aluminum alloy with its shallowly-embedded aluminum carbide and silicon carbides.

The final step involves the removal of argon gas from the vessel and backfilling with acetylene and/or methane for the deposition of the amorphous hydrogen-containing carbon. Since this is a deposition step and not an implantation step, lower energy levels are suitable at a plasma pressure of about 2.0 to 70 mtorr. A hydrogen-containing amorphous carbon layer is built up on the surface to a desired thickness of, e.g., about 1 to 10 micrometers to complete the process. The coating is adherent, wear and scuff resistant and "slippery".

Thus, the process involves successive immersion of workpieces within different plasma compositions which treat all surfaces of the workpiece(s) while retained in plasma treatment vessels. Surface oxides are removed, carbon implanted to form carbides, an extraneous graphitic layer is removed, and a tightly adherent and extremely wear-resistant diamond-like carbon coating is formed. Thus, one or many workpieces can be introduced into and treated in the same or interconnected plasma vessel system to simultaneously and efficiently form the adherent carbon coating on all surfaces of all workpieces. When a large number of workpieces are treated simultaneously, it is preferred to apply high voltage pulses to the workpieces and to generate the plasma around the workpieces by a separate means.

Other objects and advantages of the invention will be more fully appreciated from a detailed description thereof which follows. Reference will be made to the drawing.

BRIEF DESCRIPTION OF THE DRAWING

The drawing figure schematically depicts in cross section a plasma source ion implantation vessel with a high voltage pulser and other related equipment suitable for a preferred practice of the process.

DESCRIPTION OF A PREFERRED EMBODIMENT

The practice of the invention utilizes a suitable plasma immersion ion treatment apparatus. The Figure of the drawing depicts schematically and in partial cross-section such apparatus and auxiliary equipment at 10. The apparatus system 10 includes a suitable vessel 12 which may be a cubical box (as shown) or a cylinder. Vessel 12 has a door (not shown) for introducing and removing workpieces and for maintenance of the interior chamber 14. The vessel 12 is constructed so as to be air tight and capable of sustaining low pressures (i.e., vacuum) as low as 1 microtorr in its inner chamber 14. In order to provide such low pressures, a suitable vacuum system 16 is connected through exhaust line 18 to chamber 14.

All of the walls 20 of vessel 12 are electrically interconnected and electrically maintained at a common potential. The vessel may be grounded as indicated at 22.

A workpiece carrying stage or platform 24 is mounted on post 26, which electrically insulates platform 24 from the vessel walls 20. Provision is made to cool the stage 24 such as by circulating deionized water or other electrically insulating cooling fluid through coils indicated schematically at 28. In the operation of the system 10, workpieces 30 such as aluminum A390 alloy piston heads will be placed on stage 24.

Provision is made for the admission of a variety of gases into chamber 14. Thus, a plurality of gas lines indicated at 32, 34 and 36, respectively, lead from separate gas sources (not shown) to common line 38 and through needle valve 40 into chamber 14. In the practice of the process as will be described in more detail below, gases such as argon (through line 32), methane (through line 34) and acetylene (through line 36) will be bled through needle valve 40 into chamber 14 after evacuation by vacuum system 16 to a suitable working gas pressure. Once one of such gases has been introduced into chamber 14, a plasma is generated in the gas by means of a suitable plasma generator such as a radio frequency generator indicated schematically at 42. The plasma generator is employed to generate respectively positive argon ions, positive methane ions, positive acetylene ions, positive ions of the partially or completely disassociated constituents of these gases, or the like for treatment of workpieces 30. Depending upon the specific operation being performed, the working pressure of the gas or plasma within the vessel will typically and suitably lie within the range of 0.1 mtorr to about 100 mtorr. Such pressure is maintained through the operation of the vacuum system and the bleeding of the gas into the chamber.

Each plasma completely fills the chamber and completely immerses workpieces 30. In order to accelerate the positive ions in the plasma toward workpieces 30, high voltage, short duration negative potential pulses are continually applied to the workpieces. This is suitably accomplished by employment of a high voltage pulser 43, which is electrically connected through lead 44 to work stage 24. The work stage 24 is electrically conductive and conducts the high voltage pulses to workpieces 30. However, lead 44 is electrically insulated from wall 20, and the stage 24 is likewise electrically insulated from the vessel by post 26. The pulser 43 is capable of generating high voltages as will be described in the respective operating steps below. For the implantation step, the pulses are suitably of short duration, typically in the range of 10 to 30 microseconds, and continually applied at a frequency of several kilohertz. For sputtering and deposition steps, the pulses are of high duty cycle, typically in the range of 20 percent to 95 percent. Desirably, the wave form of the voltage pulses is as square as possible, especially during the implantation and deposition steps. This, of course, means a very fast rise to the applied voltage level, maintenance at that level during the desired time, and then a very rapid fall from the voltage level. The purpose of the pulses is to accelerate positive ions from the plasma toward and against the surfaces of workpieces to obtain sputtering for cleaning, implantation or coating as will be described at the desired energy level. To the extent that the wave form departs from its desired square shape, ions with undesired kinetic energies are accelerated toward the workpieces and produce results that might not be desirable, especially during the implantation and deposition steps. The process steps each rely on the suitable kinetic energy of the plasma ions and not upon thermal diffusion or other thermodynamic equilibrium mechanism. However, thermal diffusion may be used as an additional control mechanism for achieving deeper penetration of ions during the implantation process.

In an alternative embodiment, an rf generator (not shown), which may or may not be the same physical piece of equipment as rf generator 42, can also be used to produce a dc self-bias on workpieces 30 for sputtering or deposition steps. Such rf generator would be connected to work stage 24 via lead 44 and/or other suitable means not depicted in the figure.

A general description of method and apparatus for plasma source implantation may be found in U.S. Pat. No. 4,764,394.

This process has been utilized in one example to apply hard, adherent carbon coatings to aluminum alloy A390 workpieces, including the skirt portions of pistons made from such alloys. The nominal composition of the 390 alloy is, by weight, 17 percent silicon, 0.8 percent iron, 4.5 percent copper, 0.050 percent manganese, 0.580 percent magnesium, 0.040 percent chromium, 0.950 percent zinc, 0.1 percent titanium and the balance substantially all aluminum. Piston skirts cast from such alloys thus would contain a surface region that would contain not only atoms of the respective elements of the composition but also oxides that have formed on the surface with aluminum and silicon.

In the case of the aluminum alloy workpieces, it is necessary to remove oxygen atoms from the surfaces before proceeding further with the process. This oxide decomposition process may not be necessary with other workpiece materials. The oxide removal can be carried out by any suitable cleaning process. However, since subsequent process steps are carried out in an ion plasma implantation vessel 12, it is preferred to confine the workpieces in the vessel for all of the processing steps.

Thus, one or more workpieces such as aluminum alloy 390 pistons are introduced into vessel 12 and the chamber 14 evacuated to a very low pressure to remove atmospheric gases from the chamber. The pressure is suitably reduced to about 1 microtorr ($10^{-6}$ torr). With vacuum system 16 still running, argon gas through line 32 is then slowly bled into the chamber to reach a stable operating argon gas pressure of about 0.4 mtorr. A suitable range for this argon sputter cleaning step is from 0.2 mtorr to 2 mtorr. The selected pressure is dependent upon the energy intended to be applied to the workpieces. Once the argon pressure has been stabilized at, for example, 0.4 mtorr, the plasma generator 42 is started and the glow of the plasma comprising electrons and positive argon ions is apparent through a viewing window (not shown) in vessel 12. Upon the establishment of the argon positive ion-containing plasma, the high voltage pulser 43 is activated at a repetition rate of several kilohertz and voltage pulses of about 1.2 kV. In the case of the argon plasma, this produces argon ion energies of about 1.2 keV. In general, a voltage level of 1 to 10 kV is suitable for sputter cleaning.

In an alternative method, an rf generator (not shown) is connected to work stage 24 (in place of the depicted plasma generator 42 and pulser 43) through lead 44. When such rf generator is started, an argon plasma with positive argon ions is established. Also, a dc self-bias of about 1000 V is produced on the workpiece to induce bombardment of the workpiece with a flux of 1000 eV argon ions.

Either of the two above-described methods leads to a flux of argon ions that sputters off oxygen atoms. A sputtering time of the order of 60 minutes is found to be sufficient for suitable removal of oxides from the surface region of the aluminum alloy workpieces. During the sputtering operation, cooling deionized water or other electrically insulating cooling fluid is circulated through cooling passages 28 in the workpiece platform 24 in order to remove heat from the workpieces generated by the sputtering.

The first principal step in the subject process is the implantation of carbon ions into the surface of the cleaned workpiece(s) 30. The plasma generator 42 is inactivated, as is the high voltage pulser 43. The flow of argon gas is shut off, and argon gas is pumped from the chamber 14 by the vacuum system 16. Methane gas or other suitable hydrocarbon is introduced into the chamber as through line 34. The pressure of methane gas is suitably in a range from about 0.2 to 6 mtorr, and the plasma is again re-established through utilization of plasma generator 42. High voltage pulses at a repetition rate of several kilohertz and at approximately 20 kV are applied to the workpieces by pulser 43 through the workpiece stage 24. A suitable voltage level for this carbon implantation step is in the range of about 5 kV to 40 kV. At the application of 20 kV pulses, the implantation of the positive carbon and hydrocarbon ions into the workpiece surface is continued until a dosage of about 2 to $5\times10^{17}$ ion/cm$^2$ is obtained. Approximately one hour is required to obtain a suitable implantation level of the carbon or hydrocarbon ions into the surface to a dose of 2 to $5\times10^{17}$ ion/cm$^2$, although this depends upon the workpiece surface area and implant current capacity of high voltage pulser 43. If the pressure or the repetition rate is changed, then the processing time is also changed. The effect of the implantation is to form aluminum carbides and silicon carbides which are apparently uncrystalline in nature. However, it is particularly the silicon carbide moieties present in the thin surface region of the workpieces which ultimately provide the adherent substrate for the final carbon deposit.

It has been found, due apparently to the inability to obtain a perfectly square voltage wave form, that in addition to the carbon ions that are implanted into the workpiece, a thin layer of extraneous carbon apparently in the form of graphite is deposited on the surface. It is believed that the depth of the implanted carbon is of the order of 20 to 120 nm. The superficial layer of amorphous carbon is apparently much less than the thickness of the implanted carbon.

In order to form a suitably adherent carbon deposit on the carbon implanted surface, it is necessary to remove the graphitic layer. This is accomplished by shutting down the plasma generator 42 and the high voltage pulser 43, pumping the methane gas from the chamber 14 and backfilling the chamber with argon gas as from line 32. An argon pressure of about 0.4 mtorr (suitably 0.2 mtorr to 2 mtorr) is maintained in the chamber as in the previous argon sputter step.

Plasma generation is recommenced as is application of 1.2 kV negative impulses to the workpiece by actuating the high voltage pulser 43. The effect of the high voltage pulses applied to workpiece 30, which is immersed in the argon ion plasma, is to accelerate argon ions against the graphite-coated surfaces. After a period of about 5 to 10 minutes, the sputtering by the argon ions suitably removes the graphitic deposit from the surface of the carbon implanted workpiece. The plasma generator 42 and voltage pulser 43 are shut down and argon gas pumped from the chamber.

In an alternative practice to the use of the voltage pulser 43, an rf generator (not shown) is connected to work stage 24 as through lead 44. As described above, activation of the rf generator produces an argon plasma in an argon gas-filled chamber and produces a suitable dc self-bias on workpiece 30 to promote sputtering of the graphite deposit from the surface of the workpiece.

The chamber 14 was then backfilled with acetylene in preparation for the deposit of a hard adherent amorphous carbon film on the surface of the carbon implanted workpiece. The gas pressure of the acetylene is suitably in the range of 2 to 70 mtorr. The purpose of this step is to deposit carbon on the surface, not to implant it. Accordingly, lower energy levels are employed. While acetylene is used in this example, other low molecular weight hydrocarbon gases such as methane are suitable. An acetylene pressure of 4.5 mtorr is employed and 600 volt negative pulses (30 μsec duration) are applied to the workpieces with a duty cycle of 20 percent to 95 percent.

Alternatively, an rf generator (not shown) is used to generate an acetylene plasma and produce a negative dc self-bias of 600 V on workpiece 30.

This process was continued, in the case of dc self-bias, for about 150 minutes, during which time a uniform layer of adherent, hard, hydrogen-containing carbon was formed that was about 5 micrometers in thickness. Depending upon the application of the workpiece in which the coating was formed, in general it is felt that carbon coatings 1 to 5 micrometers or higher, for example, 10 μm, are suitable.

The purpose of the above coating process with respect to aluminum pistons was to determine whether pistons thus coated could be operated, particularly in cold start situations, in an engine utilizing a cast aluminum alloy engine block without any liner. During cold start situations, there is a dearth of oil on the surface of the cylinder walls, and it is not uncommon for the aluminum pistons to engage the aluminum cylinder walls without any lubricant film between them. In normal operation, it is found that scuffing occurs between the aluminum piston and the aluminum wall. That is to say, aluminum metal is transferred from the cylinder wall to the piston, which promotes wear and tear in the engine and is unsuitable for long-term engine life. However, bench tests and engine tests have indicated that aluminum alloy pistons provided with a carbon coating 5 micrometers or more in thickness as produced by this process ran satisfactory during engine cold start without scuffing. Of course, it is known that diamond-like carbon coatings can provide desirable wear properties to many different substrates. The subject high voltage pulser process forms adherent coatings simultaneously on many workpieces all with complex shapes in a practice suitable for high volume production.

The precise chemical and metallurgical nature of the carbon coatings has not been fully analyzed. In general, the coatings are amorphous, although they may contain some nanometer-size crystals of carbon. The coatings also contain some hydrogen, probably about one hydrogen atom per three or so carbon atoms. Thus, in general the coatings can be characterized as amorphous to nanocrystal carbon that contains a minor portion of hydrogen. Sometimes these coatings are referred to as diamond-like carbon coatings. They are not diamond in constitution, but they do contain an appreciable fraction of $sp^3$ bonds between their carbon atoms. The coatings display high hardness values, and they provide lubricity in friction applications.

It has been observed that when other metals, synthetic plastics or glass are placed in the subject plasma source ion implantation apparatus, they are likewise coated with the hard amorphous carbon in the same manner as the aluminum alloy coated workpieces described above. Such materials have been used in connection with the fixtures for test workpieces, and when they are not electrically insulated from the high voltage pulser, they experience the same processing conditions as the workpieces and they are likewise coated. It is clear that the subject process of implanting carbon into a workpiece, sputter removing the extraneous graphitic carbon that is coincidentally formed during the carbon implantation, and then applying an amorphous carbon coating is of general application to a wide range of workpiece materials.

This process basically relies solely upon the kinetic energy of the ions in the plasma for its execution. However, when the ions impact the workpiece, they do promote heating. For this reason, the workpiece is cooled to maintain it at a suitable temperature. For example, it is not preferable to have a significant amount of diffusion of the implanted or coated ions into the workpiece.

An advantage of the subject process is that all unmasked surfaces of three-dimensional workpieces can be implanted or coated uniformly and at the same time. The practice is not limited by the disadvantages of line-of-sight treatments. Furthermore, if desired, the workpieces can be treated continually and automatically in a single vessel or system without removal to the ambient.

While this invention has been described in terms of a preferred embodiment thereof, it will be appreciated that other forms could readily be adapted by one skilled in the art. Accordingly, the scope of this invention is to be considered limited only by the following claims.

The embodiments of the invention in which an exclusive property or privilege is claimed are defined as follows:

1. A method of forming an adherent, hard carbon coating on an article composed of a material receptive to carbon ion implantation, comprising:

immersing said article in a first plasma atmosphere containing positive carbon ions and accelerating said ions against surfaces of said article to implant carbon ions into said surfaces and, coincidentally, form an overlying deposit of carbonaceous material, thereafter immersing the article in a positive ion containing plasma of a gas chemically inert with respect to the article and accelerating positive ions against said deposit on said article to bombard said carbonaceous deposit with said ions and thereby remove it from carbon-implanted surfaces, and thereafter immersing said article in a plasma containing positive carbon ions and accelerating said positive ions against the carbonaceous deposit-free surfaces of said article to deposit an adherent hydrogen-containing carbon layer on said carbon-implanted surfaces.

2. A method of forming a hard carbon coating on an article composed of a metal alloy receptive to carbon ion implantation, comprising:

removing oxygen from surfaces of said article that are to be coated, immersing said article in a first plasma atmosphere containing positive carbon ions and accelerating said ions against surfaces of said article to implant carbon atoms into said surfaces and form a metal carbide in said surfaces and, coincidentally, form an overlying deposit of carbonaceous material, thereafter immersing the article in a positive ion containing plasma of a gas chemically inert with respect to the alloy and accelerating said ions against said deposit to bombard said carbonaceous deposit and remove it from the carbide-containing surfaces, and thereafter immersing said article in a plasma containing positive carbon ions while accelerating said ions against the carbonaceous deposit-free surfaces to deposit an adherent hydrogen-containing carbon layer on said carbide-containing surfaces.

3. A method of forming an adherent, hard carbon coating on a silicon-containing aluminum alloy article comprising:

removing oxygen from surfaces of said article that are to be coated, immersing said article in a first plasma atmosphere containing positive carbon ions while continually applying negative electrical potential pulses to said article to implant carbon ions into the surfaces of said article and form silicon carbide in said surfaces and, coincidentally, to form overlying deposits of carbonaceous material, thereafter immersing the article in a positive ion containing plasma of a gas chemically inert with respect to the alloy and applying negative electrical pulses to said article to bombard said carbonaceous deposit with said ions and thereby remove it from the carbide-containing surfaces, and thereafter immersing said article in a second plasma containing positive carbon ions while applying negative electrical potential pulses to deposit an adherent, hard hydrogen-containing carbon layer on said carbide-containing surfaces.

4. A method of forming an adherent, hard carbon coating on a silicon-containing aluminum alloy article comprising:

removing oxygen from surfaces of said article that are to be coated, immersing said article in a first plasma atmosphere containing positive carbon ions while applying negative electrical potential pulses to said article to implant carbon ions into the surfaces of said article to a depth up to about 250 nanometers and form silicon carbide in said surfaces and, coincidentally, form overlying deposits of carbonaceous material that are of a lesser thickness than the carbon ion implantation depth, thereafter immersing the article in a positive argon ion containing plasma and applying negative electrical pulses to said article to bombard said carbonaceous deposit with said ions to remove the deposit from the carbide-containing surfaces, and thereafter immersing said article in a second plasma containing positive carbon ions while applying negative electrical potential pulses to deposit an adherent hydrogen-containing carbon layer on said carbide-containing surfaces, the thickness of said carbon layer being in the range of about 1 micron to about 10 microns.

* * * * *